United States Patent [19]
Takahashi

[11] Patent Number: 5,635,743
[45] Date of Patent: Jun. 3, 1997

[54] SEMICONDUCTOR DEVICE HAVING AN INCREASED WITHSTAND VOLTAGE AGAINST AN INVERSE SURGE VOLTAGE

[75] Inventor: Mitsuasa Takahashi, Tokyo, Japan

[73] Assignee: NEC Corporation, Tokyo, Japan

[21] Appl. No.: 604,295

[22] Filed: Feb. 21, 1996

Related U.S. Application Data

[63] Continuation of Ser. No. 341,975, Nov. 16, 1994, abandoned.

[30] Foreign Application Priority Data

Nov. 22, 1993 [JP] Japan .................. 5-315985

[51] Int. Cl.$^6$ .................. H01L 29/76; H01L 29/94; H01L 31/062; H01L 31/113
[52] U.S. Cl. .................. 257/343; 257/328; 257/339; 257/341; 257/409
[58] Field of Search .................. 257/339, 341, 257/343, 409, 328

[56] References Cited

U.S. PATENT DOCUMENTS 4,300,150  11/1981  Colak .................. 257/409
5,034,790  7/1991  Mukherjee .................. 257/409

FOREIGN PATENT DOCUMENTS 3-242976  10/1991  Japan .................. 257/409

Primary Examiner—Steven H. Loke
Attorney, Agent, or Firm—Burns, Doane, Swecker & Mathis, LLP

[57] ABSTRACT

It is the object of the invention to provide a semiconductor device with a high-voltage breakdown characteristic against an overvoltage surge from an inductance load. The semiconductor device according to the invention has a lower withstand voltage of a substrate diode compared with that between source and drain electrodes, and a P$^-$-substrate has an increased impurity concentration. The inverse surge generated by the inductance load is absorbed by the substrate diode and does not flow into a P-base of MOSFET. Accordingly, a parasitic NPN transistor does not turn on, and thereby the semiconductor device with the high withstand voltage against the inverse surge voltage can be provided.

5 Claims, 2 Drawing Sheets

SEMICONDUCTOR DEVICE HAVING AN INCREASED WITHSTAND VOLTAGE AGAINST AN INVERSE SURGE VOLTAGE

This application is a continuation of application Ser. No. 08/341,975, filed Nov. 16, 1994, abandoned.

FIELD OF THE INVENTION

The invention relates to a semiconductor device, and especially to a construction of a semiconductor device having a high-voltage breakdown characteristic against an overvoltage surge.

BACKGROUND OF THE INVENTION

A lateral double-diffused MOS transistor is used in various fields of electrical and electronics engineering, such as power electronics. In this semiconductor device, a high-voltage breakdown characteristic against an overvoltage surge is regarded as the most important, especially when used for switching a current flowing into an inductance load. An outline of a typical construction of a conventional semiconductor device is as follows. Two island shaped N-type regions with high impurity concentration are formed on a N-type layer, which covers a P-type substrate. One of the two island shaped N-type regions is surrounded by a P-type region serving as a base, and plays a role of a source region. The other region is a drain region. A current is controlled by a voltage of a gate electrode separated from a surface of a channel region by an insulating film. The weakest point against a surge voltage in this construction is a curved portion of a P-N junction, where the electric field is concentrated. The withstand voltage of the device can be increased to some extent by suitably selecting a depth and an impurity concentration of an N-layer. Another approach to overcome the aforementioned disadvantage is to add one or two P-type layers to this construction in order to decrease the electric field around the curved portion of the P-N junction, however, a further improvement is extremely desirable.

SUMMARY OF THE INVENTION

Accordingly, it is an object of the invention to provide a semiconductor device with a high-voltage breakdown characteristic against an overvoltage surge, which is impressed between source and drain electrodes. According to a feature of the invention, a semiconductor device according to the invention comprises:

- a semiconductor substrate of a first type conductivity having a semiconductor layer of a second type conductivity thereupon, two island shaped semiconductor regions of the second type conductivity positioned at a predetermined interval of a surface of the semiconductor layer of the second type conductivity, one of which is surrounded by a surface-adjoining semiconductor region of the first type conductivity and a thin semiconductor layer with a predetermined length formed on a surface of the semiconductor layer of the second type conductivity between the two island shaped regions,
- wherein one of the two island shaped regions of the second type conductivity surrounded by the surface-adjoining semiconductor region, a remaining one of the two island shaped regions, the surface-adjoining semiconductor region of the first type conductivity, the thin semiconductor layer of the first type conductivity and the semiconductor layer of the second type conduction serve as a source region, a drain region, a base region, an electric field relaxation semiconductor layer and an extended drain region respectively, and moreover the thin semiconductor layer of the first type conductivity and the semiconductor layer of the second type conductivity have the same potential, and
- the semiconductor device comprises the semiconductor substrate of the first type conductivity and the semiconductor layer of the second type conductivity which have a lower withstand voltage therebetween than that between the source and drain regions.

BRIEF DESCRIPTION OF THE DRAWINGS

The invention will be explained in more detail in conjunction with appended drawings, wherein.

DESCRIPTION OF THE PREFERRED EMBODIMENTS

Before explaining a semiconductor device in the preferred embodiment according to the invention, the aforementioned conventional semiconductor devices will be explained in referring to FIGS. 1 and 2.

Figure 1:
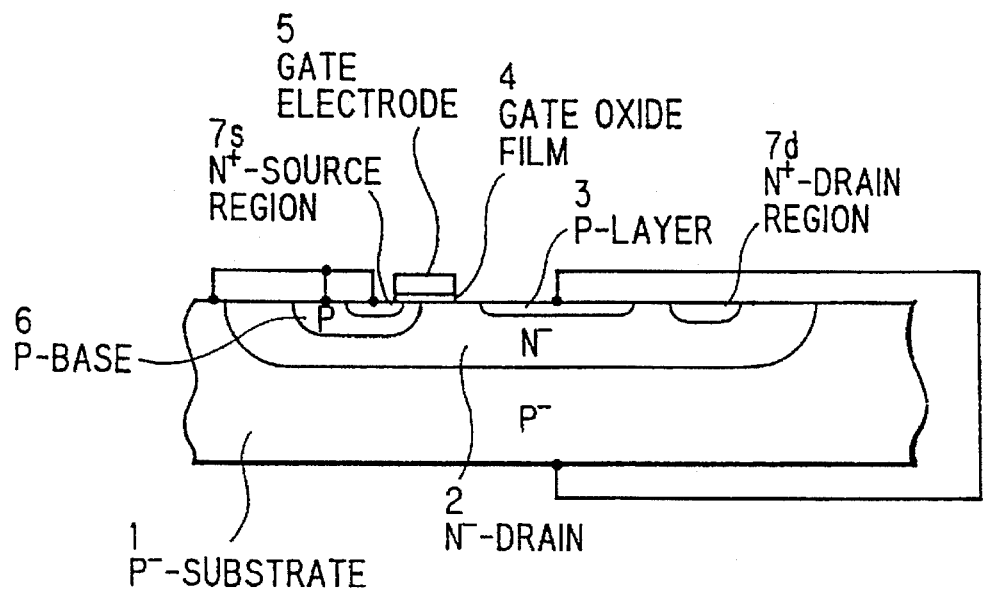
FIG. 1 shows a cross-sectional view of a conventional semiconductor device.

A conventional semiconductor device is fabricated by forming a N$^-$-drain 2, a P-region (P-layer) 3, a gate oxide film 4, a gate electrode 5, a P-base 6, a N$^+$-source region 7s and a N$^+$-drain region 7d successively on a boron doped P$^-$-substrate 1 with an impurity concentration of about 5E14/cm$^3$ for instance as shown in FIG. 1, and has a withstand voltage between source and drain regions of 300 V as disclosed on Japanese Patent Kokai No. 3-242976.

Figure 2:
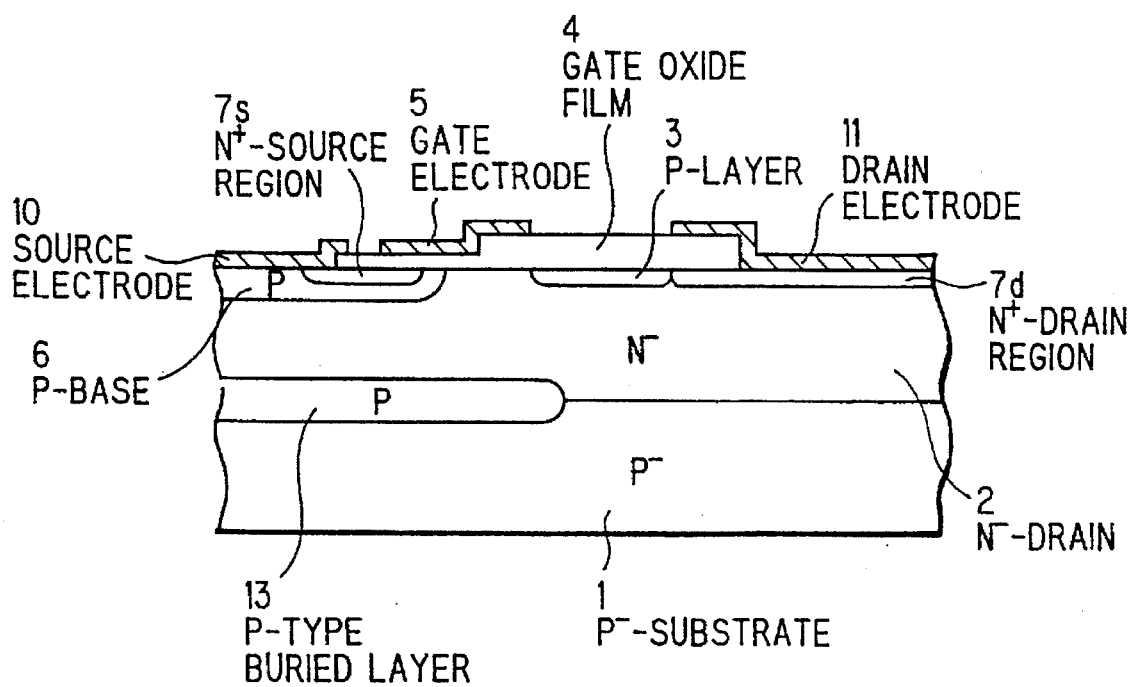
FIG. 2 shows a cross-sectional view of another conventional semiconductor device.

Another conventional semiconductor shown in FIG. 2 as an example is fabricated by forming a P-type buried layer 13, a N$^-$-drain 2, a P-layer 3, a gate oxide film 4, a gate electrode 5, a P-base 6, a N$^+$-source region 7s, an N$^+$-drain region 7d, an source electrode 10 and a drain electrode 11 successively on a boron doped P$^-$-substrate 1 with a doping level of about 4E14 atoms/cm$^2$, and achieves a withstand voltage between source and drain electrodes of 370 V as disclosed on U.S. Pat. No. 4,300,150.

In conventional semiconductor devices, shown in FIGS. 1 and 2, the impurity concentration of the P$^-$-substrate 1 is sufficiently low and the withstand voltage between the N$^-$-drain 2 and the P$^-$-substrate 1 is sufficiently higher than that between source and drain electrodes, such that the withstand voltage between source and drain electrodes is determined by the impurity concentration of the N$^-$-drain 2 and a length between source and drain regions.

For example, in the conventional semiconductor device shown in FIG. 1, the withstand voltage between the N$^-$-drain 2 and the P$^-$-substrate 1 is about 530 V, which is sufficiently higher than that between drain and source electrodes of 300 V, because the impurity concentration of the P$^-$-substrate 1 is about 5E14/cm$^3$.

In the conventional semiconductor device shown in FIG. 2, the withstand voltage between the N$^-$-drain 2 and the P$^-$-substrate 1 is about 630 V, which is sufficiently higher than that between drain and source electrodes of 370 V, when the doping level of the P$^-$-substrate 1 is about 4E14 atoms/cm$^2$.

Conventional semiconductor devices with high-voltage breakdown characteristic have a disadvantage that, when used for driving an inductance load, a breakdown arises between source and drain electrodes on account of an inverse surge generated by the inductance, and a breakdown current causes a voltage drop across the P-base 6, when this current flows therethrough, and a parasitic NPN transistor composed of the N$^+$-source region 7s, the P-base 6 and the N$^-$-drain 2 is made to turn-on, and the semiconductor device is destroyed on account of concentration of the electric current.

In order to overcome the abovementioned disadvantages, in a semiconductor device according to the invention, an impurity concentration of a P$^-$-substrate is made to be high, and a withstand voltage between a N$^-$-drain 2 and a P$^-$-substrate 1 is made to be lower than that between source and drain electrodes, and thereby a desired semiconductor device with a high-voltage breakdown characteristic against an overvoltage surge impressed between drain and source electrodes is achieved.

Figure 3:
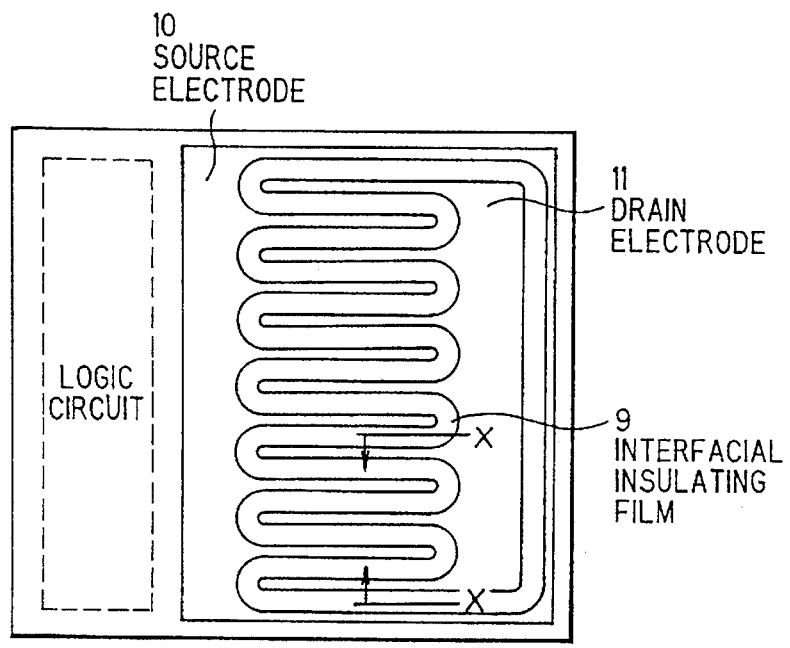
FIG. 3 shows a planar view of a semiconductor device according to the invention as a preferred embodiment of the invention.

The invention will be explained concretely by referring to FIGS. 3 and 4. FIG. 3 is a planar view showing a preferred embodiment of the invention and FIG. 4 is a cross-sectional view of FIG. 3 along a line X—X.

Figure 4:
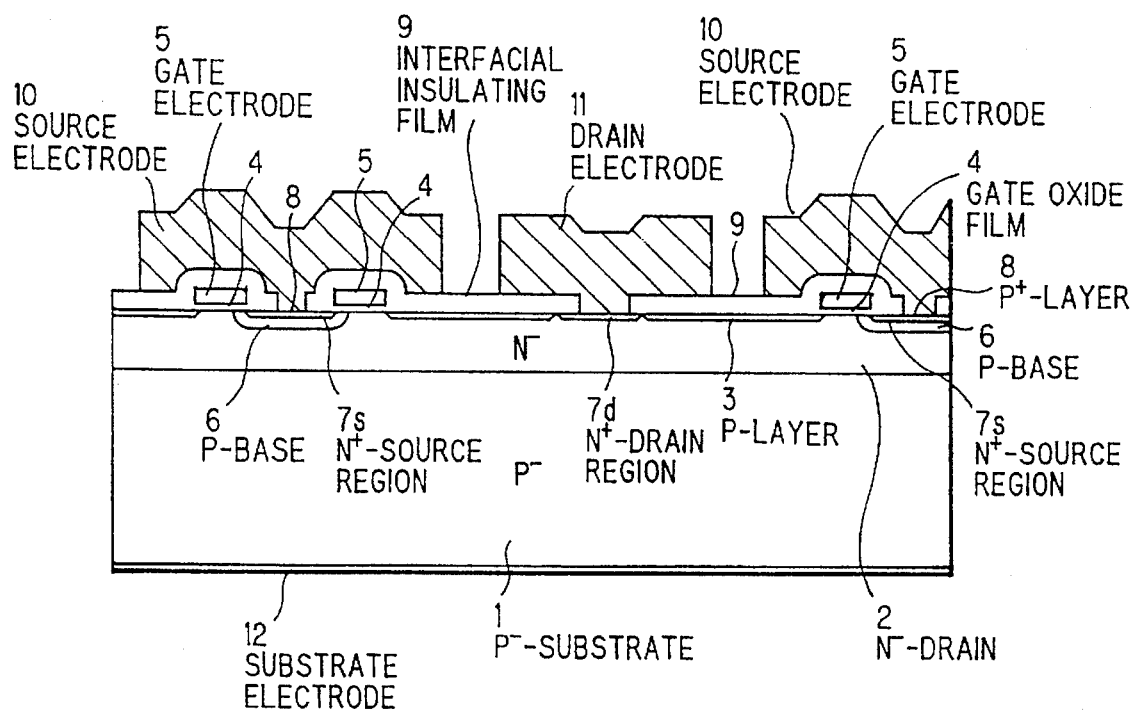
FIG. 4 shows a cross-sectional view along a X—X line in FIG. 3.

Selecting a case that a withstand voltage between source and drain electrodes is 600 V as an example in the preferred embodiment shown in FIG. 4, a boron doped substrate with an impurity concentration of about 4E14/cm$^3$ is used as a P$^-$-substrate 1.

A N$^-$-drain 2 is formed by a phosphor ion implantation with an acceleration voltage of about 150 keV and a dose amount of about 3E12/cm$^2$ and by a subsequent heating process at about 1200° C. and for about 360 min. A P-layer (a P$^-$-layer) 3 is formed by a boron ion implantation with an acceleration voltage of about 100 keV and a dose amount of about 7E12/cm$^2$, and completed with a formation of an oxide film with a depth of about 7600 Å by oxidation process at 980° C. and for about 200 min.

A gate oxide film 4 with a thickness of about 0.05 μm and a phosphor doped region with an impurity concentration of about 5E19/cm$^3$ and a thickeness of 0.6 μm, which corresponds to a gate electrode 5, are formed. Thereafter, a P-base 6 with a depth of about 3 μm and a surface impurity concentration of about 8E17/cm$^3$ is formed by boron ion implantation with an accelerating voltage of about 70 keV and a dose amount of about 8E13/cm$^2$ and a subsequent heating process at about 1140° C. and about 145 min.

Next, a N$^+$-source region 7s and a N$^+$-drain region 7d with a depth of about 0.3 μm and a surface impurity concentration of about 1.5E20/cm$^3$ is formed by arsenic ion implantation with an accelerating voltage of 70 keV and a dose amount of about 5E15/cm$^2$ and a subsequent heating process at about 1000° C. and for about 10 min. Thereafter, a P$^+$-layer 8 is formed by a boron ion implantation with an accelerating voltage of about 50 keV and a dose amount of 5E15/cm$^2$.

Subsequently, an interfacial insulating layer 9 with a depth of about 1 μm, and aluminum source and drain electrodes with a depth of about 1.1 μm, which are denoted by 10 and 11 respectively, are formed into predetermined patterns, and a semiconductor device according to the invention is completed.

Also, a lead region is provided for connecting the P-base 6 to the source electrode 10. The lead region is formed of a P-type layer and is positioned in a through-hole of the N$^{36}$-source region 7s.

Of course, a photo-resist technology is used in impurity doping and patterning processes.

In a semiconductor device in an embodiment of the invention, a withstand voltage between source and drain electrodes is determined by a length of the P-layer (the P$^-$-layer) 3, and a withstand voltage of 730 V is achieved in a case that this length is about 80 μm. On the other hand, a withstand voltage between the P$^-$-substrate 1 with the boron concentration of about 4E14/cm$^3$ and the N$^-$-drain 2 is about 630 V, wherein the P$^-$-substrate 1 and the source electrode 10 have the same potential (a wiring is not shown in FIG. 4), and the withstand voltage between source and drain electrodes is higher than that of a substrate diode, namely a diode composed of the N$^-$-drain 2 and the P$^-$-substrate 1. The semiconductor device in the preferred embodiment is for a voltage rate of 600 V. In the case of a voltage rate of about 50 V, an impurity concentration of the N$^-$-drain 2 is lower than that of the P$^-$-substrate 1.

It should be noted that the P-layer 3 and the N$^-$-drain 2 in FIG. 4 correspond to an electric field relaxation layer for protecting the P-base 6 and an extended drain region respectively.

In the aforementioned embodiment, when a difference between the withstand voltage of source-drain electrodes and that of the substrate diode is about 100 V, the semiconductor device can absorb a larger surge energy compared with that in a case of a conventional one by a factor larger than 2.

Application of the invention is not limited to the aforementioned embodiment, but may also be applied to a P-channel MOSFET. In such a case, if types of conductivity in semiconductor elements in the construction shown in FIG. 4 are interchanged to each other, and polarities of voltage applied to electrodes are inverted, a semiconductor device with similar electrical property can be obtained.

As described in the above, in the semiconductor device according to the invention, the inverse surge generated by the inductance load is absorbed by the substrate diode, does not flow into the P-base of the MOSFET and the parasitic NPN transistor does not turn-on, because the withstand voltage of the substrate diode is lower than that between source and drain electrodes. Accordingly, this device has the very high withstand voltage against the inverse surge, and can absorb the larger inverse surge energy compared with that in a case of a conventional device by a factor larger than 2, when a difference between the withstand voltages of source-drain electrodes and that of the substrate diode is about 100 V.

Although the invention has been described with respect to specific embodiments for complete and clear disclosure, the appended claims are not to be thus limited but are to be construed as embodying all modification and alternative constructions that may be occur to one skilled in the art which fairly fall within the basic teaching here is set forth.

What is claimed is:

1. A semiconductor device, comprising:
   a semiconductor substrate of a first conductivity type having a semiconductor layer of a second conductivity type disposed thereupon; and
   two island shaped semiconductor regions of said second conductivity type positioned at a predetermined interval in a surface of said semiconductor layer of said second conductivity type;
   one of said two island shaped semiconductor regions being surrounded by a surface-adjoining semiconductor region of said first conductivity type and a thin semiconductor layer of said first conductivity type with a predetermined length formed on a surface of said semiconductor layer of said second conductivity type between said two island shaped regions; and said one of said two island shaped regions of said second conductivity type surrounded by said surface-adjoining semiconductor region, a remaining one of said two island shaped regions, said surface-adjoining semiconductor region of said first conductivity type, said thin semiconductor layer of said first conductivity type and said semiconductor layer of said second conductivity type serve as a source region, a second drain region, a base region, an electric field relaxation semiconductor layer and a drain region respectively;

wherein a breakdown voltage between said semiconductor substrate of said first conductivity type and said semiconductor layer of said second conductivity type is lower than a breakdown voltage between said source and second drain regions, and an impurity concentration of said semiconductor substrate is higher than an impurity concentration of said semiconductor layer of said second conductivity type.

2. A semiconductor device, according to claim 1, wherein:

said breakdown voltage between said semiconductor substrate of said first conductivity type and said semiconductor layer of said second conductivity type is about 100 V lower than said breakdown voltage between said source and second drain regions.

3. A semiconductor device, according to claim 1, wherein: said impurity concentration of said semiconductor substrate is about $4E14/cm^3$.

4. A semiconductor device, comprising:

a semiconductor substrate of a first conductivity type;

a first drain region provided on said semiconductor substrate, said first drain region being of a second conductivity type opposite to said first conductivity type;

a source region and a second drain region provided on said first drain region, said source region and said second drain region being of said second conductivity type, and said source region and said second drain region being formed on said first drain region;

a base region provided on said first drain region, said base region being of said first conductivity type, and being positioned between said source region and said second drain region and between said first drain region and said source region; and a field relaxation region provided at a position between said source region and said second drain region on said first drain region, said field relaxation region being of said first conductivity type;

wherein a junction breakdown voltage across said semiconductor substrate and said first drain region is about 100 V lower than a breakdown voltage across said source region and said second drain region.

5. A semiconductor device, comprising:

a semiconductor substrate of a first conductivity type;

a first drain region provided on said semiconductor substrate, said first drain region being of a second conductivity type opposite to said first conductivity type;

a source region and a second drain region provided on said first drain region, said source region and said second drain region being of said second conductivity type, and said source region and said second drain region being formed on said first drain region;

a base region provided on said first drain region, said base region being of said first conductivity type, and being positioned between said source region and said second drain region and between said first drain region and said source region; and a field relaxation region provided at a position between said source region and said second drain region on said first drain region, said field relaxation region being of said first conductivity type; wherein an impurity concentration of said semiconductor substrate is higher than an impurity concentration of said first drain region, and a length of said field relaxation region is determined to provide a junction breakdown voltage across said semiconductor substrate and said first drain region being about 100 V lower than a breakdown voltage across said source region and said second drain region.

* * * * *